US006852615B2

(12) United States Patent
Micovic et al.

(10) Patent No.: US 6,852,615 B2
(45) Date of Patent: Feb. 8, 2005

(54) OHMIC CONTACTS FOR HIGH ELECTRON MOBILITY TRANSISTORS AND A METHOD OF MAKING THE SAME

(75) Inventors: Miroslav Micovic, Newbury Park, CA (US); Tahir Hussain, Calabasas, CA (US); Paul Hashimoto, Los Angeles, CA (US); Janna Ruth Duvall, Lawndale, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/457,506

(22) Filed: Jun. 9, 2003

(65) Prior Publication Data

US 2003/0227027 A1 Dec. 11, 2003

Related U.S. Application Data

(60) Provisional application No. 60/388,098, filed on Jun. 10, 2002.

(51) Int. Cl.[7] .............................................. H10L 21/338
(52) U.S. Cl. ...................... 438/604; 438/571; 438/572; 438/663; 438/763; 438/975; 438/978; 257/155; 257/194; 257/260; 257/267; 257/453; 257/473
(58) Field of Search ................................. 438/167, 172, 438/479, 534, 571, 572, 597, 604, 606, 663, 761, 763, 975, 978, FOR 173, FOR 179, FOR 335, FOR 339, FOR 385, 180; 257/155, 194, 260, 267, 449, 453, 471, 473

(56) References Cited

U.S. PATENT DOCUMENTS

| | | | | | |
|---|---|---|---|---|---|
| 5,196,358 | A | * | 3/1993 | Boos | 438/186 |
| 6,248,666 | B1 | * | 6/2001 | Frijlink et al. | 438/689 |
| 6,395,588 | B2 | * | 5/2002 | Igarashi et al. | 438/172 |
| 6,525,346 | B2 | * | 2/2003 | Mizutani | 257/183 |
| 2001/0042860 | A1 | * | 11/2001 | Hata et al. | 257/21 |

* cited by examiner

*Primary Examiner*—George Fourson
*Assistant Examiner*—Joannie Adelle Garcia
(74) *Attorney, Agent, or Firm*—Ladas & Parry LLP

(57) ABSTRACT

A process and related product in which ohmic contacts are formed in High Electron Mobility Transistors (HEMTs) employing compound substrates such as gallium nitride. An improved device and an improvement to a process for fabrication of ohmic contacts to GaN/AlGaN HEMTs using a novel two step resist process to fabricate the ohmic contacts are described. This novel two-step process consists of depositing a plurality of layers having compounds of Group III V elements on a substrate; patterning and depositing a first photoresist on one of the layers; etching recessed areas into this layer; depositing ohmic metals on the recessed areas; removing the first photoresist; patterning and depositing a second photoresist, smaller in profile than the first photoresist, on the layer; depositing more ohmic metal on the layer allowing for complete coverage of the recessed areas; removing the second photoresist, and annealing the semiconductor structure.

31 Claims, 5 Drawing Sheets

OHMIC CONTACTS FOR HIGH ELECTRON MOBILITY TRANSISTORS AND A METHOD OF MAKING THE SAME

CROSS-REFERENCE TO RELATED APPLICATIONS

This application is related to and claims the benefit of U.S. Provisional Application No. 60/388,098, "Ohmic Contacts for High Electron Mobility Transistors and a method of making Same," filed on Jun. 10, 2002, the entire contents of which are incorporated herein by reference.

BACKGROUND

1. Field

This disclosure relates to a semiconductor device, in particular, to High Electron Mobility Transistors (HEMTs), and a method of making the same. This disclosure describes an improved device and an improvement to a process for fabrication of ohmic contacts to GaN/AlGaN HEMTs using a novel two step resist process to fabricate the ohmic contacts.

2. Description of the Related Art

A semiconductor in which the concentration of charge carriers is characteristic of the material itself rather than of the content of impurities and structural defects of the crystal is called an intrinsic semiconductor. In an ideal intrinsic semiconductor, mobility is determined by lattice scattering; that is, collisions between lattice waves (phonons) and electron waves (electrons). In an actual intrinsic specimen there are always some atomic impurities that may dominate scattering at low temperatures when phonons are quiescent, but at higher temperatures lattice scattering, particularly by optical phonons, is dominant. At cryogenic temperatures (e.g., T=4° K to 77° K) ionized impurity scattering does indeed dominate mobility. In addition, the theory of Brooks and Herring predicts, and experimentation confirms, that as a result of electron-electron scattering at a given temperature, mobility decreases with increasing impurity concentration, and for each doping level there is a theoretical maximum mobility.

The prior art, known to the inventors, that is improved by this invention is the current process for fabricating GaN HEMT ohmic contacts. In the prior art, GaN HEMT ohmic contact fabrication process, the baseline GaN HEMT structure shown in FIG. 1, consists of, starting at the substrate 10, a 10–20 nm thick AlN or $Al_yGa_{(1-y)}N$ nucleation layer 11a, a 250 nm to 4000 nm thick GaN layer 11b and a 10 nm to 40 nm thick strained AlGaN Schottky barrier layer 11c. The Al content x in a ternary $Al_xGa_{(1-x)}N$ Schottky barrier layer 11c could be any value between 0.1 and 0.4. For the purpose of the following discussion of the prior art, an x value of 0.3 and a Schottky barrier 11c thickness of 30 nm is chosen. The mobile two dimensional electron gas (2DEG) charge at the AlGaN/GaN interface is obtained by piezoelectric and spontaneous polarization due to lattice mismatch induced strain between the GaN 11b and the AlGaN Schottky barrier layer 11c, and not by doping. The electron charge density is roughly proportional to Al content x in the Schottky barrier layer 11c (strain) and thickness of the Schottky barrier 11c, (due to less surface charge depletion). It was empirically established that the best combination of the 2DEG sheet charge and specific ohmic contact resistance is obtained for x values between 0.15 and 0.3 and Schottky barrier 11c thickness between 20 nm and 40 nm. The upper value of x and the thickness of the Schottky barrier 11c is limited by the fact that barriers with an x value higher than 0.3 give poor ohmic contacts, and that strained barriers thicker than 40 nm can not be grown due to strain relaxation.

The fabrication process of the prior art is discussed as follows. In a first fabrication process, the source and drain contact pad areas are defined into a first photoresist using an image reversal process. FIG. 2 shows a typical layout of source 12 and drain 13 pads of a GaN power HEMT. The separation between the source 12 and drain pads 13 shown in the prior art process is 2 µm. An image reversal process is used to obtain under-cut of the photoresist 14 as shown in FIGS. 3 and 4. The photoresist ledge 15 that is created by the undercut acts as a shadow mask during high vacuum metal evaporation and prevents metal from depositing onto the photoresist side-walls 16. The photoresist profile undercut obtained by the prior art process is approximately 0.25 µm.

During the next fabrication step, as shown in FIG. 3, the Schottky barrier layer 11c is etched by Chlorine plasma in a Reactive Ion Etching (RIE) system to reduce the Schottky barrier thickness. This step is called ohmic recess etching, and regions in which the Schottky barrier is etched are called recessed areas 17. It was empirically established that ohmic contact resistance is minimized when the Schottky barrier layer 11c is thinned to between 7.5 nm and 10 nm. The cross section of the device structure formed by the steps up to this point is shown in FIG. 3. A structure with a thinner 7.5 nm to 10 nm thick Schottky barrier that would not require a RIE etching step is, unfortunately, not suitable for fabrication of GaN HEMTs, because its 2DEG sheet charge is too low for semiconductor device applications. By using the ohmic recess etch process, the 2DEG sheet charge is reduced only in recessed areas 17.

The semiconductor structure, after ohmic recess etching, is loaded into a high vacuum e-beam evaporator and ohmic metals 18 are evaporated in the following sequence: 20 nm Ti, 200 nm Al, 50 nm Ni and 50 nm Au. The cross section of the device structure after this step is shown in FIG. 4. This figure also illustrates that the prior art process provides for unprotected recessed areas 17a, which is its major flaw. The unprotected recessed areas 17a are not covered by the ohmic metals 18. The unprotected recessed areas 17a have adverse effects on performance and reliability of GaN HEMTs because 2DEG sheet charge in these areas is by almost a factor of three lower than sheet charge in areas not etched by Cl plasma. The low 2DEG sheet charge in unprotected recessed areas is too low to support high current densities typical for GaN HEMTs. It is reasonable to assume that high electric fields and electron velocity saturation arise in these areas at high current densities, just as they do underneath the gate of the device. The presence of the second high field region in a HEMT degrades frequency response, power-added efficiency, and power handling capability of the device. It also contributes to needless heating of the device, and hence accelerates device degradation. Device performance would be improved by elimination of unprotected recessed areas.

The photoresist 14 is lifted off by a 1-hour soak in a mild photoresist stripper at 100° C. and rinsing in DI water. Photoresist residues are not completely removed during the lift-off process. The presence of photoresist residues after ohmic metal lift-off is the second major weakness of the prior art ohmic contact fabrication process. Attempts to completely remove these residues by extended soak in a mild photoresist stripper are unsuccessful. A soak in a harsh photoresist stripper removes these residues, but it unfortunately attacks the ohmic metal.

The fabrication of ohmic contacts 19, is concluded by a 30 second rapid thermal anneal (RTA) at 875° C. in nitrogen as shown in FIG. 5. In FIG. 5, the device cross section after RTA is shown. During this high temperature anneal, according to current theories of n-type GaN ohmic contacts, an AlTiN alloy with low Schottky barrier height is converted to heavy n-type AlGaN through a chemical reaction between ohmic metal and underlying semiconductor films. The formation of ohmic contacts is facilitated by the fact that GaN and AlGaN layers underneath the ohmic metal are due to loss of nitrogen converted to heavy n-type material 20, as nitrogen vacancies become donors in these Group III V semiconductors. The electrical properties of GaN HEMT layers not covered by the ohmic metal during high temperature anneal are, due to absence of the chemical reaction, not significantly altered during this step. Photoresist residues, mentioned above, melt and flow during high temperature annealing and leave residues in the active area of the device. These residues get buried underneath the gate metal during subsequent processing steps. It is not clear at this moment how presence of these residues under the gate metal affects performance of the devices. However, it is well documented in the literature that impurities underneath the gate metal adversely affect the performance of field effect transistors (FETs).

The disadvantages of the prior art process include incomplete coverage of the recessed areas by the ohmic metals. The low 2DEG sheet charge in unprotected recessed areas 17a is too low to support high current densities typical for GaN HEMTs. It is reasonable to consider that high electric fields and electron velocity saturation arise in these areas at high current densities, just as they do underneath the gate of the device. The presence of a second high field region in a HEMT degrades frequency response, power-added efficiency, and power handling capability of the device. It also contributes to needless heating of the device, and hence accelerates device degradation. Furthermore, this prior art process leaves photoresist residues in the active areas of the device. It is common knowledge, for people skilled in the art of semiconductor devices, that impurities underneath the gate metal adversely affect the performance of field effect transistors (FETs).

SUMMARY

The process and related device presented in this invention involve complete coverage of ohmic recessed areas with ohmic metal which improves access resistance and reliability of the resulting device. The low 2DEG sheet charge regions, which limit the performance of HEMTs fabricated by the prior art process, are eliminated. This improves frequency response, power-added efficiency, and power handling capability of the device. It also decreases device heating, and hence improves device reliability. Furthermore, the process and related device of the instant invention also involve eliminating photoresist residues in the source-drain region, which additionally improves the device performance.

An embodiment of the present invention is a process for fabricating a Group III V semiconductor structure comprising the steps of depositing Group III IV elements in three layers, with a first layer, a second layer, and a third layer, wherein said first layer is deposited on a substrate, said second layer is deposited on said first layer, said third layer is deposited on said second layer; patterning and depositing a first photoresist on said third layer; providing an unprotected portion of said third layer, wherein said unprotected portion of said third layer is not in contact with said first photoresist; reducing a thickness of said unprotected portion of said third layer to form a recessed area; removing said first photoresist; patterning and depositing a second photoresist on said third layer; depositing said ohmic metal on at least a portion of said third layer, wherein said ohmic metal covers said recessed area; removing said second photoresist; and annealing said semiconductor structure.

Another embodiment of the present invention is a semiconductor structure which comprises: a substrate; a first layer, a second layer, and a third layer, each having compounds of Group III V elements, wherein said first layer is in contact with said second layer, said second layer is in contact with said first layer and said third layer, said third layer is in contact with said second layer; a recessed area of said third layer; a non-recessed area of said third layer; and ohmic metal, wherein said recessed area of said third layer is covered by said ohmic metal.

DETAILED DESCRIPTION

The process for fabricating GaN HEMT ohmic contacts of the instant invention is described in detail as follows. FIGS. 6–10 depict a preferred embodiment of fabricating a device according to the present invention. The fabrication method is further described below.

Figure 1:
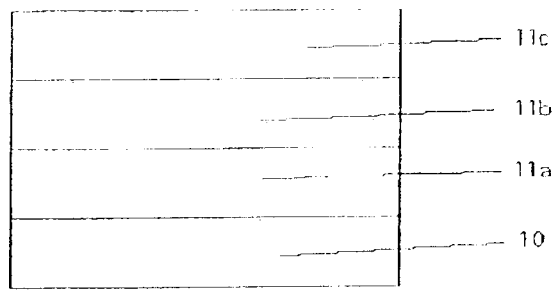
FIG. 1 (Prior Art) represents a baseline GaN HEMT structure.
Figure 2:
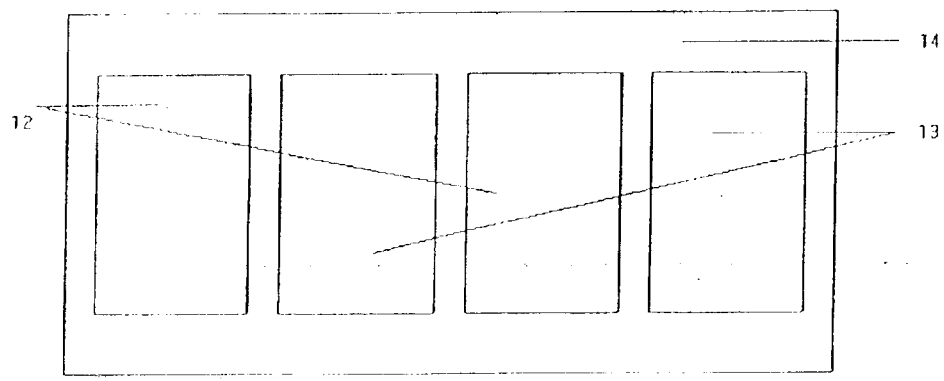
FIG. 2 (Prior Art) is a typical layout of source-drain pads of a GaN power HEMT for a preferred embodiment.
Figure 3:
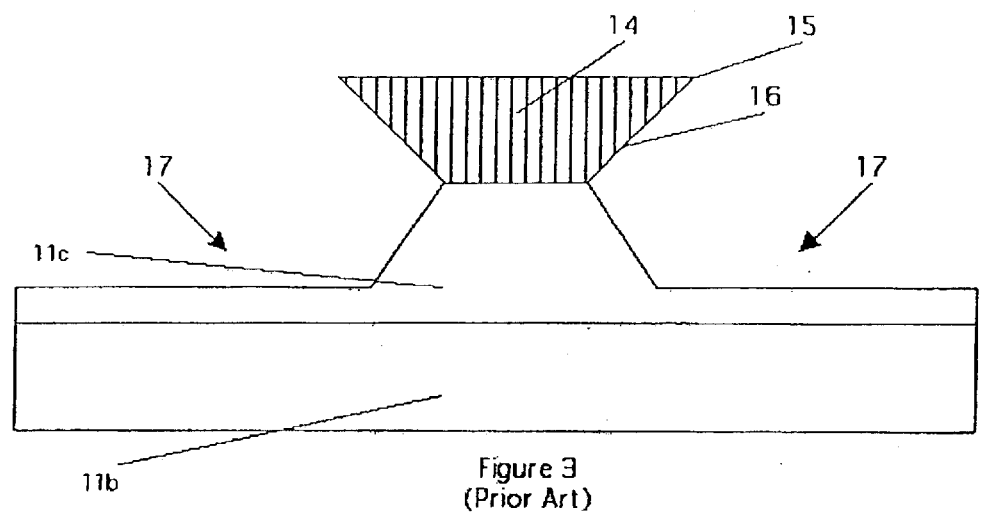
FIG. 3 (Prior Art) is a cross section of a device fabricated by prior art process after Cl RIE etching step.
Figure 4:
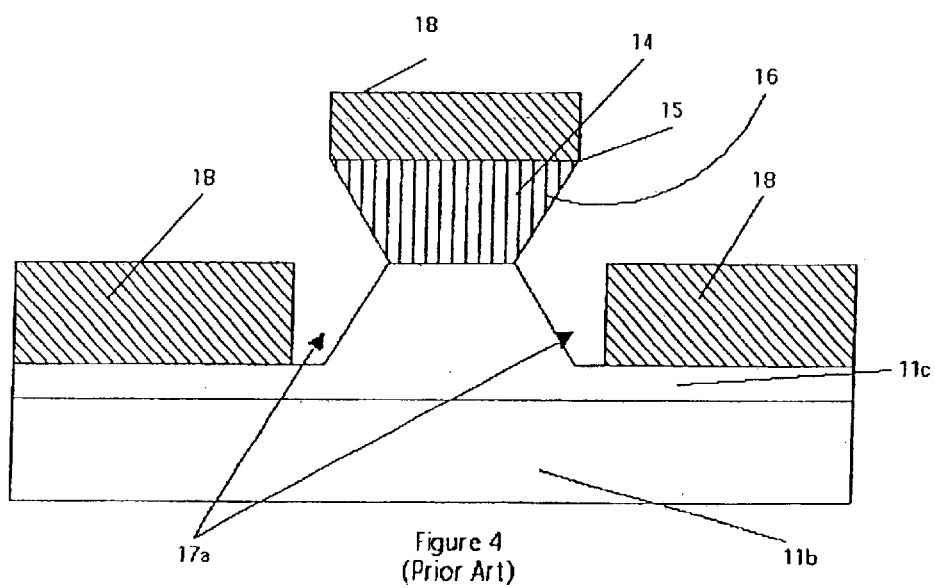
FIG. 4 (Prior Art) is a cross section of a device fabricated by prior art process after ohmic metal deposition.
Figure 5:
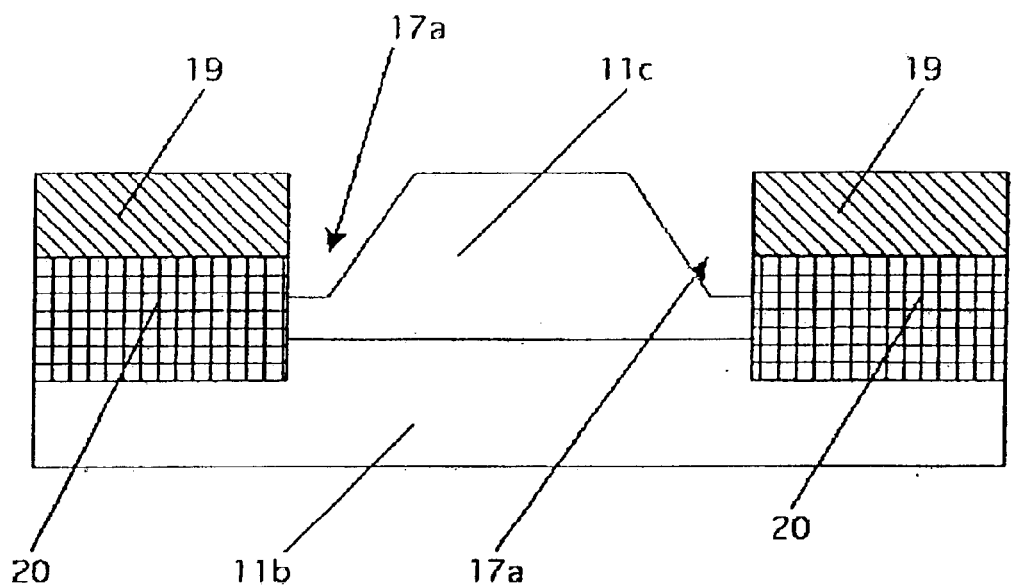
FIG. 5 (Prior Art) is a cross section of a device fabricated by prior art process after rapid thermal anneal.

A GaN high electron mobility transistor (HEMT) semiconductor structure, as shown in FIG. 1, comprising a 10–20 nm thick AlN or $Al_yGa_{(1-y)}N$ nucleation layer 11a, a 250 nm to 4000 nm thick GaN layer 11b and a 1.0 nm to 40 nm thick AlGaN Schottky barrier layer 11c is deposited onto a sapphire or semi-insulating SiC or any other substrate 10 by either Molecular Beam Epitaxy (MBE) or by Metalorganic Chemical Vapor Deposition (MOCVD). In the preferred embodiment, the Al content x in a ternary $Al_xGa_{(1-x)}N$ Schottky barrier layer 11c could be any value between 0.1 and 0.4. In a preferred embodiment, x has a value of 0.3. In this structure a mobile two dimensional electron gas (2DEG) charge is induced at the interface between GaN 11b and the $Al_xGa_{(1-x)}N$ Schottky barrier layer 11c by the piezoelectric and spontaneous polarization due to lattice mismatch induced strain between the GaN layer 11b and the Schottky barrier layer 11c, and not by doping.

Next, gross alignment markers are preferably formed by depositing and patterning metal (20 nm of Ti, 200 nm of Au) to form gross alignment markers for stepper lithography and unique serialization numbers for chips and test structures using image reversal contact lithography and photoresist lift-off by soak in a mild photoresist stripper. The mild photoresist stripper preferably contains an inexpensive inert carrier solvent such as diethylene glycol monoethylether or the like. Inexpensive, inert carrier solvents such as diethylene glycol monoethylether or the like are used to reduce stripper costs, because amine chemistries are expensive. Preferably, the mild photoresist stripper is BAKER PRS-1000® (J. T. Baker, Phillipsburg, N.J.) positive photoresist stripper. Fine, robust alignment markers for stepper and e-beam lithography are preferably formed by using image reversal stepper lithography and photoresist lift-off by soak in a mild photoresist stripper. Metal is deposited to form these fine, robust alignment markers and preferably consists of 20 nm Ti and 40 nm of W, or Pt.

Figure 6:
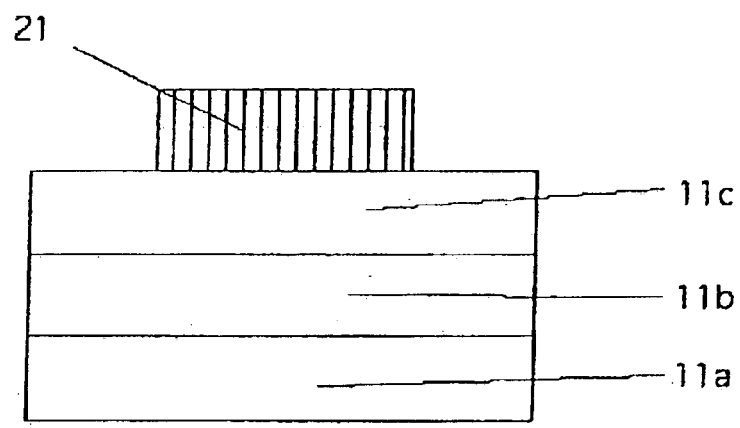
FIG. 6 is a cross section of a preferred embodiment of a device fabricated by process of the instant invention prior to ohmic recess etching.
Figure 7:
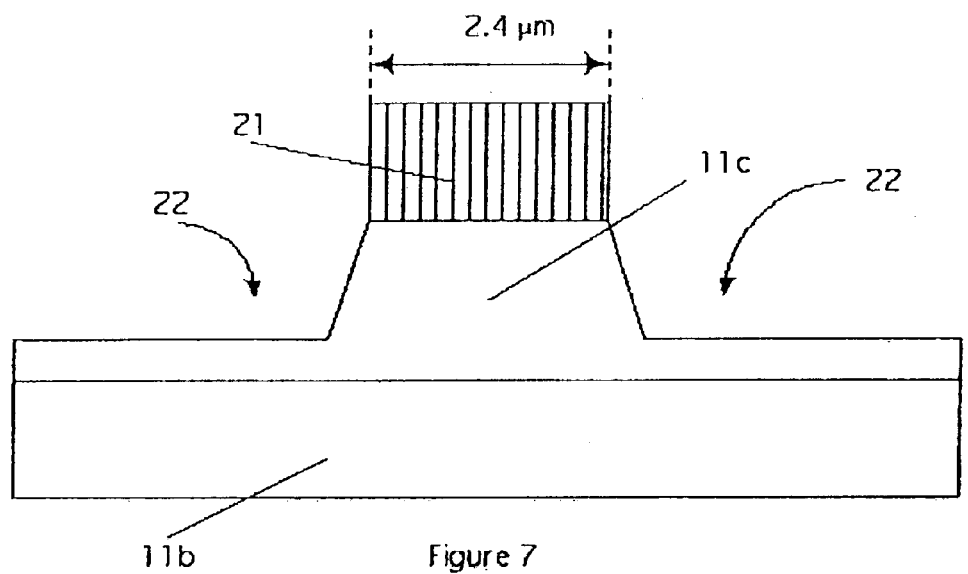
FIG. 7 is a cross section of a preferred embodiment of a device fabricated by process of the instant invention after ohmic recess etching.

In a preferred embodiment shown in FIGS. 6 and 7, after the formation of the gross and fine alignment markers, a first photoresist 21 is applied and patterned to define source and drain contact pads for ohmic recess etching using stepper lithography as shown in FIGS. 6 and 7. The final separation between the source and drain pads in the prior art process is typically 2 $\mu$m. The patterned separation between the source and drain pads of the instant invention in the embodiment shown in FIG. 6 is defined by the first photoresist 21 for the ohmic recess etch step preferably being 2.4 $\mu$m, which is 0.4 $\mu$m more than the final separation between the source and drain pads. According to the current invention, an arbitrary separation between the source and drain pads, requires that the patterned separation between the source and drain pads defined into the first photoresist layer be more than the final separation between the source and drain pads.

Ohmic recess etching by Chlorine plasma in a Reactive Ion Etching (RIE) system reduces the Schottky barrier 11c thickness. The Schottky barrier 11c is thinned to between 7.5 nm and 10 nm resulting in recessed areas 22. Device cross section after this step is shown in FIG. 7.

Preferably, the first photoresist 21, lacking a photoresist ledge, is removed by a 1-hour soak in a harsh photoresist stripper followed by rinsing in isopropyl alcohol and DI water. The harsh photoresist stripper is preferably BAKER PRS-3000™ (J. T. Baker, Phillipsburg, N.J.). Some harsh strippers, such as BAKER PRS-3000™, contain water. The water can react with the chemicals in the stripper, resulting in by-products that may corrode metal interconnects and plugs. This is particularly true when two dissimilar metals are in contact with each other and exposed to the stripper and water at the same time creating the potential for galvanic corrosion. Unlike in the prior art process, the harsh photoresist stripper can be used for this step, because ohmic metal, which is damaged by harsh photoresist remover, is not yet present on the semiconductor structure. In the prior art process, a photoresist ledge must be used with the first photoresist to prevent deposition of ohmic metals on the sidewalls of the photoresist. Unlike in the prior art process, this aspect of the current invention allows for complete removal of any photoresist residues as well as complete coverage of recessed areas with ohmic metals.

Figure 8:
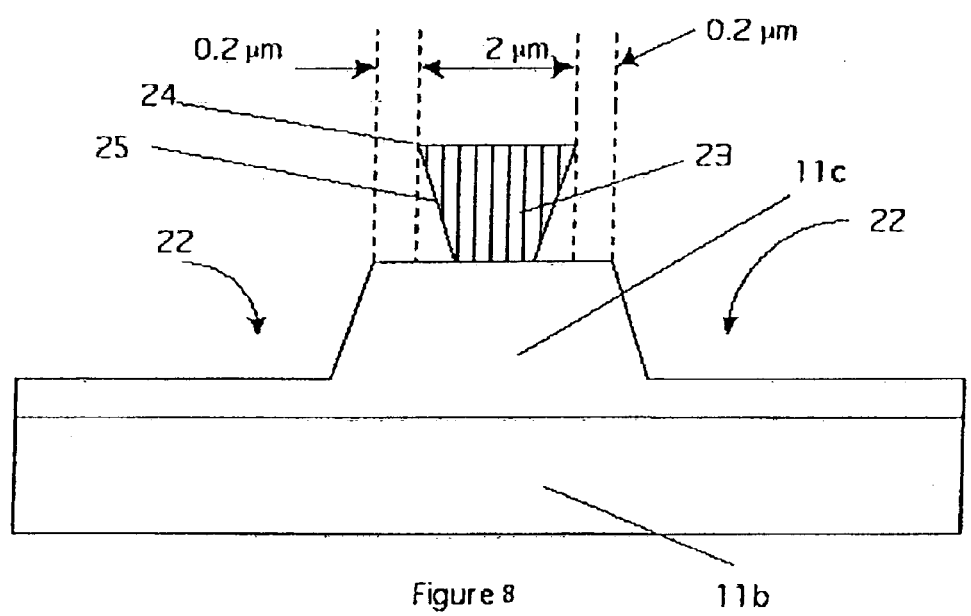
FIG. 8 is a cross section of a preferred embodiment of a device fabricated by process of the instant invention showing photoresist profile before ohmic metal deposition.

The current process further differs from the prior art through the use of a second photoresist 23. The second photoresist 23 shown in FIG. 8, having a photoresist ledge 24, is applied and patterned to further define the source and drain contact pads for ohmic metal lift-off using image reversal process and stepper lithography. The patterned separation between the source and drain contact pads defined by the second photoresist 23 should be shorter than the separation between the source and drain contact pads defined by the first photoresist 21 in order to ensure complete coverage of recessed areas 22 by ohmic metal. Device cross section after this step is shown in FIG. 8. The photoresist ledge 24 of the second photoresist 23 prevents ohmic metal from forming on the sidewalls 25 of the photoresist. The use of this photoresist ledge 24 facilitates later removal of the second photoresist 23 with a mild photoresist stripper as no ohmic metals can form on the sidewalls 25 of the second photoresist 23.

Figure 9:
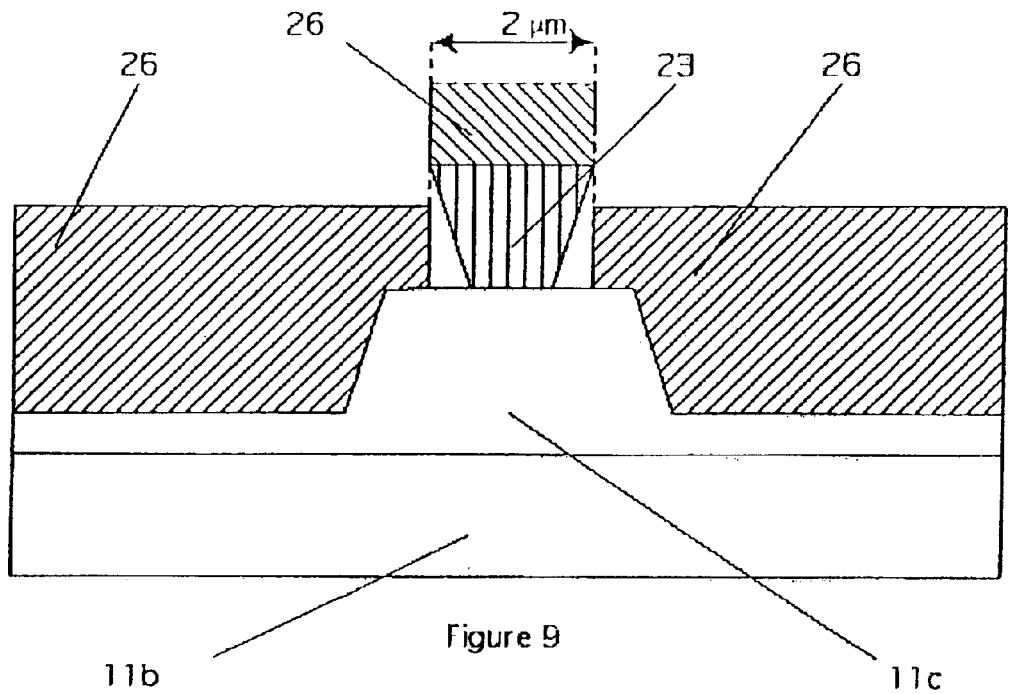
FIG. 9 is a cross section of a preferred embodiment of a device fabricated by process of the instant invention after ohmic metal deposition.

Next ohmic metal deposition is performed using an e-beam evaporator. In a preferred embodiment as shown in FIG. 9, the ohmic metals 26 are evaporated in the following sequence: 20 nm Ti, 200 nm Al, 50 nm Ni and 50 nm Au or alternatively 20 nm Ti, 200 nm Al, 100 nm Pt. Device cross section after this step is shown in FIG. 9.

Figure 10:
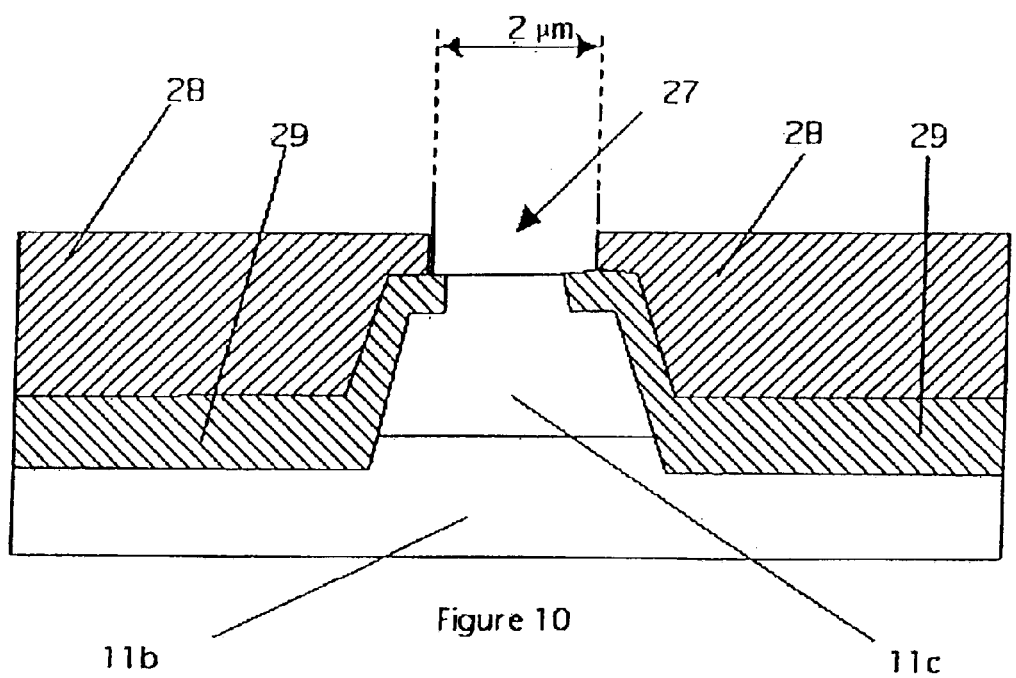
FIG. 10 is a cross section of a preferred embodiment of a device fabricated by process of the instant invention after rapid thermal anneal.

Preferably, the second photoresist 23 is lifted off by a 1 hour soak in a mild photoresist stripper at 100° C. and rinse in DI water leaving a non-recessed area 27 shown in FIG. 10. The fabrication of the ohmic contacts 28, shown in FIG. 10, is concluded by a 30 second rapid thermal anneal (RTA) at 875° C. in nitrogen. As nitrogen vacancies become donors in these Group III V semiconductors, and due to loss of nitrogen, the formation of ohmic contacts is facilitated by the fact that GaN and AlGaN layers underneath the ohmic metal are converted to heavy n-type material 29. The device cross section after this conversion to heavy n-type material 29 is shown in FIG. 10.

Those skilled in the art will recognize, or be able to ascertain employing no more than routine experimentation many equivalents to the specific structures, steps, functions, and materials described specifically herein, and such equivalents are intended to be encompassed within the scope of the following claims. Inclusion of compositions and any other features related to any materials disclosed herein is hereby incorporated into the specification by mere reference to these materials.

What is claimed is:

1. A process for fabricating a Group III V semiconductor structure comprising the steps of:

depositing Group III V elements in three layers, with a first layer, a second layer, and a third layer, wherein said first layer is deposited on a substrate, said second layer is deposited on said first layer, said third layer is deposited on said second layer; patterning and depositing a first photoresist on said third layer; providing an unprotected portion of said third layer, wherein said unprotected portion of said third layer is not in contact with said first photoresist;

reducing a thickness of said unprotected portion of said third layer to form a recessed area;

removing said first photoresist;

patterning and depositing a second photoresist on said third layer;

depositing ohmic metal on at least a portion of said third layer, wherein said ohmic metal covers said recessed area;

removing said second photoresist; and annealing said semiconductor structure.

2. The process of claim 1, wherein in said step of depositing said ohmic metal on at least a portion of said third layer, said ohmic metal completely covers said recessed area.

3. The process of claim 1, wherein said first photoresist lacks a photoresist ledge.

4. The process of claim 1, wherein said second photoresist has a photoresist ledge.

5. The process of claim 1 further comprising the step of forming gross alignment markers for stepper lithography on said third layer.

6. The process of claim 1 further comprising the step of forming fine alignment markers for stepper lithography on said third layer.

7. The process of claim 5 wherein said gross alignment markers comprise Ti and Au.

8. The process of claim 6 wherein said fine alignment markers comprise Ti and W, or comprise Pt.

9. The process of claim 1, wherein said substrate comprises sapphire or semi-insulating SiC.

10. The process of claim 1, wherein said first layer comprises a nucleation layer.

11. The process of claim 10, wherein said nucleation layer comprises a compound of the formula $Al_yGa_{(1-y)}N$, wherein y is a value greater than zero.

12. The process of claim 10, wherein said second layer comprises GaN.

13. The process of claim 12, wherein said third layer comprises a Schottky barrier layer.

14. The process of claim 13, wherein said Schottky barrier layer comprises $Al_xGa_{(1-x)}N$ wherein x is a value between 0.1 and 0.4.

15. The process of claim 11, wherein said nucleation layer is between about 10 nm and about 20 nm thick.

16. The process of claim 12, wherein said second layer is between about 250 nm and about 4000 nm thick.

17. The process of claim 13, wherein said third layer is between about 1 nm and about 40 nm thick.

18. The process of claim 1, wherein said first photoresist defines a first distance between a source contact pad and a drain contact pad, said second photoresist defines a second distance between said source contact pad and said drain contact pad, said second distance between said source contact pad and said drain contact pad is less than said first distance between said source contact pad and said drain contact pad.

19. The process of claim 13 further comprising the step of reducing a thickness of said Schottky barrier layer.

20. The process of claim 1 further comprising the step of removing said first photoresist using a stripper, wherein said stripper is corrosive to said ohmic metal.

21. The process of claim 1 further comprising the step of removing said second photoresist using an other stripper, wherein said other stripper is inert to said ohmic metal.

22. The process of claim 1 further comprising the step of depositing said ohmic metal on a Schottky barrier layer, wherein said ohmic metal comprises at least one element from the group consisting of Ti, Al, Ni, and Au.

23. The process of claim 1 further comprising the step of forming a photoresist ledge on said first photoresist and said second photoresist.

24. The process of claim 1 wherein in said step of annealing said semiconductor structure, said semiconductor structure is heated for 30 seconds at 875° C. in nitrogen.

25. The process of claim 1, wherein the step of annealing includes converting at least a portion of said third layer or said second and said third layer under said ohmic metal to a heavy n-type material.

26. A semiconductor structure comprising:
a substrate;
a first layer, a second layer, and a third layer each having compounds of Group III V elements, wherein said first layer is in contact with said second layer, said second layer is in contact with said first layer and said third layer, and said third layer is in contact with said second layer;
a recessed area of said third layer;
a non-recessed area or said third layer; and ohmic metal, wherein said recessed area of said third layer is completely covered by said ohmic metal.

27. The structure of claim 26, further comprising a source contact pad and a drain contact pad, wherein said non-recessed area of said third layer defines a first distance between said source contact pad and said drain contact pad.

28. The structure of claim 26, wherein said non-recessed area has a thickness and said recessed area has an other thickness.

29. The structure of claim 28, wherein said thickness of said recessed area is smaller than said other thickness of said non-recessed area.

30. The structure of claim 26, wherein said non-recessed area of said third layer is not completely covered by said ohmic metal.

31. The structure of claim 26, wherein at least a portion of said third layer or said second and said third layers under said ohmic metal comprises a heavy n-type material.

* * * * *